(12) United States Patent
Boessneck et al.

(10) Patent No.: US 7,678,721 B2
(45) Date of Patent: Mar. 16, 2010

(54) LOW DIELECTRIC GLASS FIBER

(75) Inventors: Douglas S. Boessneck, Aiken, SC (US); J. Ronald Gonterman, Cub Run, KY (US); Oleg A. Prokhorenko, St. Petersburg (RU)

(73) Assignee: AGY Holding Corp., Aiken, SC (US)

( * ) Notice: Subject to any disclaimer, the term of this patent is extended or adjusted under 35 U.S.C. 154(b) by 613 days.

(21) Appl. No.: 11/586,789

(22) Filed: Oct. 26, 2006

(65) Prior Publication Data

US 2008/0103036 A1    May 1, 2008

(51) Int. Cl.
C03C 13/00     (2006.01)
C03C 13/06     (2006.01)

(52) U.S. Cl. .......................................... 501/35; 501/32
(58) Field of Classification Search ................... 501/35, 501/36, 32
See application file for complete search history.

(56) References Cited

U.S. PATENT DOCUMENTS

| | | | |
|---|---|---|---|
| 4,582,748 A | 4/1986 | Eastes et al. | |
| 4,762,809 A | 8/1988 | Imai | |
| 4,824,806 A | 4/1989 | Yokoi et al. | |
| 5,284,807 A | 2/1994 | Komori et al. | |
| 5,747,396 A | 5/1998 | Miyakoshi et al. | |
| 5,789,329 A | 8/1998 | Eastes et al. | |
| 5,958,808 A | 9/1999 | Mori et al. | |
| 6,309,990 B2 | 10/2001 | Tamura et al. | |
| 6,846,761 B2 | 1/2005 | Tamura | |
| 2001/0008864 A1 | 7/2001 | Tamura et al. | |
| 2002/0038582 A1 | 4/2002 | Holl | |
| 2003/0054936 A1 | 3/2003 | Tamura | |

FOREIGN PATENT DOCUMENTS

| | | |
|---|---|---|
| BE | 1000198 A | 8/1988 |
| DE | 3709868 A1 | 10/1987 |
| EP | 0250259 A1 | 12/1987 |
| EP | 0250259 B1 | 9/1990 |
| EP | 0831072 A1 | 3/1998 |
| EP | 0831072 B1 | 12/1999 |
| EP | 1086930 A1 | 3/2001 |
| FR | 2596387 A1 | 10/1987 |
| FR | 2596387 B1 | 8/1988 |
| GB | 2189481 A | 10/1987 |
| IT | 8719883 A0 | 3/1987 |
| IT | 1203408 A | 2/1989 |
| JP | 62226839 A2 | 10/1987 |
| JP | 6039338 B4 | 1/1988 |
| JP | 63002831 A2 | 1/1988 |
| JP | 1051345 A2 | 2/1989 |
| JP | 2268485 A2 | 11/1990 |
| JP | 03245557 A2 | 11/1991 |
| JP | 06219780 A | 9/1994 |
| JP | 7010598 A2 | 1/1995 |
| JP | 8333137 A2 | 12/1996 |
| JP | 09-002839 | 1/1997 |
| JP | 9074255 A2 | 3/1997 |
| JP | 9002839 A2 | 7/1997 |
| JP | 9221338 A2 | 8/1997 |
| JP | 9268025 A2 | 10/1997 |
| JP | 10120437 A2 | 5/1998 |
| JP | 10120438 A2 | 5/1998 |
| JP | 10167759 A2 | 6/1998 |
| JP | 10226941 A2 | 8/1998 |
| JP | 10-310967 | 11/1998 |
| JP | 11079780 A2 | 3/1999 |
| JP | 11228169 A2 | 8/1999 |
| JP | 11228170 A2 | 8/1999 |
| JP | 11292567 A2 | 10/1999 |
| JP | 2003-137590 | 5/2003 |
| JP | 2003137590 | 5/2003 |
| KR | 9004212 B1 | 6/1990 |
| WO | WO9639363 A1 | 12/1996 |
| WO | WO9816482 A1 | 4/1998 |
| WO | WO9952833 A1 | 10/1999 |
| WO | WO02094728 A1 | 11/2002 |

OTHER PUBLICATIONS

AGY Holding Corp., International Patent Application No. PCT/US07/82624 Search Report and Written Opinion dated Mar. 26, 2008.
International Preliminary Report on Patentability, corresponding to International Patent Application No. PCT/US2007/082624, dated May 7, 2009.

*Primary Examiner*—Jerry Lorengo
*Assistant Examiner*—Elizabeth A Bolden
(74) *Attorney, Agent, or Firm*—Moore & Van Allen PLLC

(57) ABSTRACT

A glass fiber having a low dielectric constant and low dielectric loss tangent consists essentially of by weight, as a glass composition, 52 to 60% of $SiO_2$, 11 to 16% of $Al_2O_3$, 20 to 30% of $B_2O_3$, and 4 to 8% of CaO, and substantially no MgO, substantially no $Li_2O$, substantially no $Na_2O$, substantially no $K_2O$, and substantially no $Ti_2O$. The glass fiber also may contain up to 2% $F_2$ by weight. The glass fiber is ideal for use as reinforcement for printed wiring boards, and has excellent dielectric properties at frequencies of about 18 GHz or higher.

36 Claims, No Drawings

LOW DIELECTRIC GLASS FIBER

FIELD OF THE INVENTION

The present invention relates to a glass fiber having a low dielectric constant, and more particularly relates to a glass fiber having a low dielectric constant and a low dielectric loss tangent, and that is suitable for use as reinforcement for high-density printed wiring boards and the like.

BACKGROUND

Modern electronic devices commonly include printed circuit boards reinforced with glass fibers. Many modern electronic devices, such as mobile or stationary wireless telephones, computers, personal data assistants ("PDA's"), and the like, have electronic systems that operate at high or ultra-high frequencies. When glass is exposed to such a high or ultra-high frequency electromagnetic field, the glass absorbs at least some energy and converts the absorbed energy to heat. The energy that is absorbed by the glass in the form of heat is called dielectric loss energy. This dielectric loss energy is in proportion to the "dielectric constant" and the "dielectric loss tangent" of the glass composition, as indicated by the following expression:

$$W = k \cdot f \cdot v^2 \cdot \epsilon \cdot (\tan \delta)$$

where "W" is the dielectric loss energy in the glass, "k" is a constant, "f" is the frequency, "$v^2$" is the potential gradient, "$\epsilon$" is the dielectric constant, and "$\tan \delta$" is the dielectric loss tangent. As the above expression indicates, the dielectric loss energy "W" increases with an increase in the dielectric constant and the dielectric loss tangent of the glass, and/or with an increase in frequency.

Two types of glass fibers commonly used to reinforce printed circuit boards are E-glass and D-glass. E-glass, however, has a relatively high dielectric constant ranging from about 6.6 to about 8.1, and a relatively high dielectric loss tangent ranging from about $12 \times 10^{-4}$ to about $26 \times 10^{-4}$ at a frequency of about 1 MHz at room temperature. Accordingly, because E-glass can yield relatively high dielectric losses, E-glass is a poor reinforcement material for printed circuit boards having higher densities of electronic components and higher processing speeds. D-glass, on the other hand, has a relatively low dielectric constant of about 4.3, and a relatively low dielectric loss tangent of about $10 \times 10^{-4}$ at a frequency of about 1 MHz at room temperature. D-glass, however, has relatively high melting temperatures, relatively poor workability, relatively poor mechanical performance, and relatively poor water resistance. In addition, D-glass may inadequately adhere to epoxy resins, and commonly includes imperfections in the form of striae and bubbles. Accordingly, neither E-glass nor D-glass are ideally suited for use as reinforcement fibers in high speed printed circuit boards, and neither is well-suited for circuit boards that operate at high or ultra-high frequencies from about 1 MHz to about 18 GHz.

Others have attempted to develop alternative glass compositions with low dielectric properties that are better suited for use in printed circuit boards for high speed and ultra-high speed electronic devices. For example, Nitto Boseki Co., Ltd. Corporation of Japan produces and markets such an alternative glass composition under the mark NITTOBO NE-GLASS®. Such alternative dielectric glass compositions typically include by percent weight about 45-65% $SiO_2$, about 13-30% $B_2O_3$, and about 8-20% $Al_2O_3$ as principal constituents. In addition, such glass compositions typically include a combination of at least some MgO and/or at least some CaO as a flux to decrease viscosity and ease melting. When used in combination, the total amount of MgO and/or CaO typically is included in amounts of at least 4 percent by weight. For example, one such composition containing at least about 4 percent by weight of MgO and/or CaO is described in published U.S. Patent Application No. US2003/0054936A1, assigned to Nitto Boseki Co., Ltd. The presence of MgO, however, can increase batching costs, cause undesirable phase separation, decrease water resistance, increase the dielectric constant and the dielectric loss tangent of the glass composition to unacceptable levels, and, if introduced as the raw material calcium magnesium carbonate ("dolomite"), can cause decrepitation. Accordingly, a glass fiber that includes at least about 4 percent CaO by weight as a fluxing agent, and substantially no MgO, would be desirable.

The newer alternative dielectric glass compositions described above also commonly include $Li_2O$, $Na_2O$, and/or $K_2O$ as fluxing agents in a total amounts less than about 0.5 percent by weight. The presence of one or more of these constituents, however, can cause the dielectric loss tangent of the glass composition to increase, and may decrease the glass composition's water resistance.

$TiO_2$ is also commonly included in alternative dielectric glass fibers to decrease viscosity, and decrease the dielectric loss tangent. The presence of $TiO_2$, however, can result in phase separation, decrease the chemical durability of the resultant glass fiber, and impart n undesirable yellow tint to the glass.

Accordingly, a dielectric glass fiber that includes substantially no MgO, substantially no $Li_2O$, $Na_2O$, and/or $K_2O$, and substantially no $TiO_2$, would be desirable.

SUMMARY

The invention includes a glass fiber having a low dielectric constant and low dielectric loss tangent that includes about 52% to about 60% of $SiO_2$, about 11% to about 16% of $Al_2O_3$, about 20% to about 30% of $B_2O_3$, and about 4% to about 8% of CaO, by weight, as a glass composition, and substantially no MgO, substantially no $Li_2O$, substantially no $Na_2O$, substantially no $K_2O$, and substantially no $Ti_2O$. The glass composition also may include up to about 2% $F_2$ by weight. The invention also includes a glass fiber having a low dielectric constant and low dielectric loss tangent that includes about 53% to about 58% of $SiO_2$, about 11% to about 15% of $Al_2O_3$, about 22% to about 27% of $B_2O_3$, and about 5% to about 8% of CaO by weight, as a glass composition, with substantially no MgO, substantially no $Li_2O$, substantially no $Na_2O$, substantially no $K_2O$, and substantially no $Ti_2O$. This glass composition can further include up to about 2% $F_2$ by weight. Furthermore, the invention includes a glass fiber having a low dielectric constant and low dielectric loss tangent that includes about 54% to about 58% of $SiO_2$, about 11% to about 14% of $Al_2O_3$, about 24% to about 27% of $B_2O_3$, and about 5% to about 6% of CaO by weight, as a glass composition, with substantially no MgO, substantially no $Li_2O$, substantially no $Na_2O$, substantially no $K_2O$, and substantially no $Ti_2O$. This glass composition can also include up to about 2% $F_2$ by weight.

DETAILED DESCRIPTION

The present invention will be explained in detail with reference to Examples. The exemplary glass compositions shown in Table 1 correspond to the appended claims, including the preferred embodiments of claim 2. Table 1 also includes typical constituent percentages and properties for E-Glass and D-Glass.

TABLE 1

| Composition (wt. %) | E-Glass | D-Glass | Example D53 | Example D54 | Example D55 | Example D57 | Example D58 | Example D59 | Example D47-2 |
|---|---|---|---|---|---|---|---|---|---|
| $SiO_2$ | 52 to 56 | 72 to 75 | 53.63 | 55.21 | 55.15 | 53.02 | 54.38 | 53.89 | 54.17 |
| $Al_2O_3$ | 12 to 16 | — | 14.47 | 12.74 | 14.51 | 14.82 | 13.93 | 13.96 | 14.26 |
| $B_2O_3$ | 5 to 10 | <23 | 23.72 | 23.80 | 22.11 | 23.83 | 23.68 | 25.03 | 24.23 |
| CaO | 16 to 25 | — | 7.80 | 7.84 | 7.82 | 7.18 | 6.84 | 6.08 | 6.85 |
| $F_2$ | 0 to 1.0 | — | 0.38 | 0.41 | 0.41 | 1.15 | 1.17 | 1.04 | 0.50 |
| MgO | 0 to 5.0 | — | — | — | — | — | — | — | — |
| $Na_2O + K_2O$ | 0 to 2.0 | <4 | — | — | — | — | — | — | — |
| $\epsilon'$ - Dielectric Constant @ 1 MHz | 6.6 to 8.1 | 4.1 | 4.81 | 4.71 | 4.77 | 4.98 | 4.87 | 4.89 | 4.67 |
| $\epsilon'$ - Dielectric Constant @ 10 GHz | 6.1 to 6.8 | 4.2 | 4.73 | 4.65 | 4.72 | 4.64 | 4.58 | 4.49 | 4.62 |
| $\epsilon'$ - Dielectric Constant @ 18 GHz | n/a | n/a | n/a | n/a | n/a | 4.64 | 4.57 | 4.49 | 4.67 |
| Dielectric Loss Tangent ($\times 10^4$) @ 1 MHz | 12 to 26 | 5 | 5 | 5 | 5 | 4 | 4 | 4 | 4 |
| Dielectric Loss Tangent ($\times 10^4$) @ 10 GHz | 39 to 62 | 25 | 28 | 30 | 32 | 25 | 24 | 25 | 28 |
| Dielectric Loss Tangent ($\times 10^4$) @ 18 GHz | N/a | n/a | n/a | n/a | n/a | 27 | 29 | 28 | 30 |
| T3 - Temp.(° C.) at which viscosity = $10^3$ poise | 1185 to 1200 | 1410 | 1328 | 1343 | 1355 | 1315 | 1341 | 1334 | 1354 |
| Water Durability: Glass elution amt. (mg/cm$^2$) | 0.06 | n/a | 0.14 | 0.17 | 0.11 | 0.14 | 0.13 | 0.17 | 0.14 |
| Delta T (° C.) (difference between Temp. of log 3.0 viscosity and liquidus temp.) | >100 | N/a | >100 | >50 | >100 | >100 | >100 | >100 | >100 |
| Young's Modulus (GPa) | 72 | 55 | n/a | n/a | n/a | 59 | 58 | 56 | 58 |
| Coefficient of Thermal Expansion (CTE) ($\times 10^7$ C$^{-1}$) | 50 | 30 | n/a | n/a | n/a | 33.9 | 35.1 | 33.9 | 33.0 |

| Composition (wt. %) | E-Glass | D-Glass | Example E1 | Example E2 | Example E3 | Example E4 | Example E6 |
|---|---|---|---|---|---|---|---|
| $SiO_2$ | 52 to 56 | 72 to 75 | 57.72 | 55.33 | 54.22 | 53.50 | 53.42 |
| $Al_2O_3$ | 12 to 16 | — | 11.33 | 14.67 | 12.02 | 14.30 | 12.87 |
| $B_2O_3$ | 5 to 10 | <23 | 23.98 | 22.28 | 26.00 | 24.90 | 26.76 |
| CaO | 16 to 25 | — | 5.82 | 5.91 | 5.94 | 5.95 | 5.91 |
| $F_2$ | 0 to 1.0 | — | 1.15 | 1.81 | 1.82 | 1.35 | 1.04 |
| MgO | 0 to 5.0 | — | — | — | — | — | — |
| $Na_2O + K_2O$ | 0 to 2.0 | <4 | — | — | — | — | — |
| $\epsilon'$ - Dielectric Constant @ 1 MHz | 6.6 to 8.1 | 4.1 | 4.46 | 4.55 | 4.52 | 4.56 | 4.53 |
| $\epsilon'$ - Dielectric Constant @ 10 GHz | 6.1 to 6.8 | 4.2 | 4.43 | 4.52 | 4.39 | 4.54 | 4.43 |
| $\epsilon'$ - Dielectric Constant @ 18 GHz | N/a | n/a | n/a | n/a | n/a | n/a | n/a |
| Dielectric Loss Tangent ($\times 10^4$) @ 1 MHz | 12 to 26 | 5 | 3 | 4 | 4 | 3 | 3 |

TABLE 1-continued

| Property | | | | | | | |
|---|---|---|---|---|---|---|---|
| Dielectric Loss Tangent (×10⁴) @ 10 GHz | 39 to 62 | 25 | 22 | 21 | 22 | 27 | 24 |
| Dielectric Loss Tangent (×10⁴) @ 18 GHz | n/a | n/a | n/a | n/a | n/a | n/a | n/a |
| T3 - Temperature (° C.) at which viscosity = $10^3$ poise | 1185 to 1200 | 1410 | 1396 | 1346 | 1357 | 1320 | 1349 |
| Water Durability: Glass elution amt. (mg/cm²) | 0.06 | n/a | 0.10 | 0.16 | 0.24 | 0.14 | 0.27 |
| Delta T (° C.) (difference between Temp. of log 3.0 viscosity and liquidus temp.) | >100 | n/a | >50 | >50 | <50 | >50 | >50 |
| Young's Modulus (GPa) | 72 | 55 | n/a | n/a | n/a | n/a | n/a |
| Coefficient of Thermal Expansion (CTE) (×$10^7$ C⁻¹) | 50 | 30 | n/a | n/a | n/a | n/a | n/a |

| Composition (wt. %) | E-Glass | D-Glass | Example E7 | Example E8 | Example E9 | Example E10 |
|---|---|---|---|---|---|---|
| $SiO_2$ | 52 to 56 | 72 to 75 | 55.06 | 55.80 | 53.67 | 55.95 |
| $Al_2O_3$ | 12 to 16 | — | 11.35 | 14.38 | 14.61 | 12.59 |
| $B_2O_3$ | 5 to 10 | <23 | 26.49 | 22.75 | 24.00 | 24.12 |
| CaO | 16 to 25 | — | 6.08 | 6.05 | 5.98 | 6.06 |
| $F_2$ | 0 to 1.0 | — | 1.02 | 1.02 | 1.74 | 1.28 |
| MgO | 0 to 5.0 | — | — | — | — | — |
| $Na_2O + K_2O$ | 0 to 2.0 | <4 | — | — | — | — |
| $\epsilon'$ - Dielectric Constant @ 1 MHz | 6.6 to 8.1 | 4.1 | 4.38 | 4.56 | 4.57 | 4.55 |
| $\epsilon'$ - Dielectric Constant @ 10 GHz | 6.1 to 6.8 | 4.2 | 4.32 | 4.49 | 4.55 | 4.44 |
| $\epsilon'$ - Dielectric Constant @ 18 GHz | N/a | n/a | n/a | n/a | n/a | n/a |
| Dielectric Loss Tangent (×10⁴) @ 1 MHz | 12 to 26 | 5 | 4 | 4 | 3 | 4 |
| Dielectric Loss Tangent (×10⁴) @ 10 GHz | 39 to 62 | 25 | 23 | 22 | 21 | 23 |
| Dielectric Loss Tangent (×10⁴) @ 18 GHz | n/a | n/a | n/a | n/a | n/a | n/a |
| T3 - Temperature (° C.) at which viscosity = $10^3$ poise | 1185 to 1200 | 1410 | 1382 | 1381 | 1323 | 1353 |
| Water Durability: Glass elution amt. (mg/cm²) | 0.06 | n/a | 0.23 | 0.16 | 0.15 | 0.16 |
| Delta T (° C.) (difference between Temp. of log 3.0 viscosity and liquidus temp.) | >100 | N/a | >100 | >50 | <50 | <50 |
| Young's Modulus (GPa) | 72 | 55 | n/a | n/a | n/a | n/a |
| Coefficient of Thermal Expansion (CTE) (×$10^7$ C⁻¹) | 50 | 30 | n/a | n/a | n/a | n/a |

Batches having the sample glass compositions shown in Table 1 were prepared as described below. Glass synthesis included batch pre-treatment (mechanical and thermal), a first melting, fritting in water or crushing, a second melting, and, finally, pouring the glass into stainless steel molds.

All batches were prepared in the form of tablets. Batch components were weighed using a calibrated scale with an accuracy ±0.005 g in amounts sufficient to produce approximately one-half pound of glass. The components were coarsely mixed, and placed into a ball mill drum having one-half gallon capacity. The constituents were finely mixed and ground in the mill drum for three hours. The resulting powdered batch was manually pressed in a mold to produce 0.7 inch by 0.5 inch tablets, and the tablets were dried at 120° C. for 3 hours in a drying oven. The dried tablets were placed into a muffle furnace, and were heated at rate of 5° C./min. to 800-850° C. The tablets were maintained at that temperature for 30 minutes. After cooling the tablets to room temperature, the tablets were either stored or used immediately for glass melting.

The tablets were melted in platinum-rhodium crucibles in a laboratory electrical furnace, supplied with eight 0.65-inch by 10-inch silicon carbide heating elements. The furnace continuously heated the materials at approximately 1550° C. for six hours, or at approximately 1630° C. for 2.5 hours. The crucibles were removed from the furnace. In order to eliminate a sufficient amount of striated glass from the surface layer of each melt, approximately 25 g of the molten mixture was poured into a heated metallic mold, and was later discarded. The remaining portion of each batch was reheated in its crucible for at least 15 min., and a portion was poured into a small platinum crucible for determining forming range viscosity temperatures. Pouring and reheating was repeated up to five times, thereby utilizing about 95 percent of the remaining portion of the glass from each melting crucible. The castings were cooled to approximately 800° C., and were placed into the muffle furnace preheated to about 750° C. for annealing. The furnace was controlled to cool the castings to approximately 350° C. at a rate of about 3° C./min. After reaching 350° C., the muffle furnace was switched off, and the castings were allowed to cool to room temperature.

Glass specimens were tested for crystallization potential. The specimens were crushed in an Abich mortar and were then sieved. Fractions of glass with a grain size of about 100 μm to about 300 μm were collected. A portion of glass grit weighing about 3 g was placed into a ring-shaped platinum dish, and heated in a pipe electrical furnace having Kanthal wire heating coils. The platinum dish was fixed at the hot end of a Pt—Pt/Rh thermocouple by a loop made of platinum wire, such that the specimen was immediately adjacent the hot joint of the thermocouple during heating. The specimens were placed in the furnace, initially stabilized at a temperature equal to either ($T_3$–100° C.) or ($T_3$–50° C.) (where $T_3$ is the temperature corresponding to viscosity log [η, Poise] equal to 3)). The time needed for a specimen to reach the required temperature was about 5-10 minutes. A specimen was maintained at the target temperature for about 16 hours. Each specimen then was removed from the furnace, and cooled in air for approximately 1-2 minutes. After cooling down to room temperature, each glass specimen was removed from its dish and inspected under a microscope at 30×-60× magnification. The specimen then was broken into smaller pieces for further optical inspection at 100× and 200× magnification. The presence of a small single crystal in any bulk location of a glass specimen was considered to constitute crystallization. Slight opalescence was considered evidence of phase separation. Thus, for example, if no crystals were evident at $T_3$–100° C., the liquidus temperature was determined to be less than $T_3$–100° C. Similarly, if no opalescence was evident at $T_3$–100° C., it was concluded that there either was no immiscibility, or that immiscibility occurred at temperatures below the liquidus temperature.

The forming viscosity temperature ($T_3$) of each sample was measured with a counterbalanced viscometer. The viscometer included a highly polished platinum-rhodium sphere suspended on a platinum-rhodium wire from a measurement device capable of measuring loads and rates of vertical movement. The sphere was immersed in molten glass within a cylindrical platinum crucible positioned inside a vertical tubular electric furnace capable of heating the molten glass specimens to 1450° C. The hot-end of a Pt—Pt/Rh thermocouple was attached to the inner surface of the platinum crucible. A temperature controller held the required temperature of the glass sample within the range of ±1 degree C. The furnace was heated to a temperature at which the viscosity of the glass specimen is presumed to be between $10^{3.5}$ and $10^{2.5}$ Poises. The platinum-rhodium sphere was slowly immersed into the molten glass. After 15 to 20 minutes, the temperature stabilized, and the measurement system balanced. Loading was sequentially increased and decreased by the measurement device, and measurements taken of the rate of sphere movement. The temperature of the molten glass was changed (by 20-25 degrees C.), and the loading/measurement operations repeated. The rate "U" of the movement of the sphere is described by the following equation:

$$U = KF/\eta$$

where "F" is the force applied to the sphere, "η" is the viscosity, and "K" is a coefficient dependent on the diameter of the sphere and the crucible containing the molten specimen. From the previous equation, it follows:

$$\log \eta = \log K + \log F - \log U$$

If one relates the rate "U" to a unity of the force applied to a sphere, then the equation is further simplified:

$$\log \eta = K^* - \log U$$

The value of the coefficient $K^*$ was empirically determined by calibrating the viscometer with NIST Standard Reference Material glass 710A. The random error of viscosity measurements was approximately equal to ±0.01 of log η, while the total error (including a systematic error connected with errors of viscometer calibration) was within ±0.03 of log η. $T_3$ was determined with an accuracy of ±3 C using a regression of viscosity data near $T_3$.

Measurements of dielectric constant and dielectric losses at a frequency of 1 MHz were made using a high-precision AC-bridge. The bridge permitted determination of characteristics of a flat layer of dielectric material placed between two plates of a capacitor inside a dust-free chamber. Before each measurement, the bridge was calibrated using six etalon samples of high purity quartz glass.

Measurements of dielectric characteristics at 10 and 18 GHz were performed using cylinder-shaped specimens placed within a short-circuited waveguide. The waveguide was constructed of pure copper, and included a polished inner surface coated with pure silver. Due to oxidation, the silver coating was periodically restored during testing. Inside the waveguide, a standing wave with a required length was established using a precision high-stability, super-high frequency generator. With no sample in the waveguide, the position of a minimum standing wave $l_0$ was determined. With a sample within the waveguide, the position of a minimum standing wave $l_1$ was determined. The coefficient of a traveling wave S and the length of a wave $\lambda_1$ was determined using the following equations:

$$\frac{\tan x}{x} = -\frac{\lambda_l}{2\pi} \cdot \frac{1}{d} \cdot \tan\left(\frac{2\pi}{\lambda_l} \cdot x_0\right); \quad x_0 = \frac{\lambda_l}{2} - (d + \Delta l)$$

Where: d is the sample thickness and $\Delta l = l_0 - l_1$ $$\varepsilon' = \frac{1 + \left(\frac{\beta k}{2\pi}\right)^2}{1 + \frac{k}{\lambda_l}}$$

$$x = \beta d; \quad y = \frac{\frac{2\pi}{\lambda_l} \cdot d}{\cot x - \frac{x}{\sin^2 x}} \cdot S \cdot \frac{1 + \tan^2\left(\frac{2\pi}{\lambda_l} \cdot x_0\right)}{\tan^2\left(\frac{2\pi}{\lambda_l} \cdot x_0\right)}$$

$$\varepsilon'' = \left(\frac{k}{2\pi}\right)^2 \cdot 2x \cdot y; \quad \tan\delta = \frac{\varepsilon''}{\varepsilon'}$$

Where k is the doubled diameter of the waveguide.

The water resistance of each glass specimen was determined by measuring the amount of material dissolved in near-boiling water over a period of time (i.e. specimen weight loss). Pre-weighed 50 mm by 3 mm glass disks were placed in wide-neck quartz flasks filled with 150 ml of distilled water. In order to prevent water evaporation at near-boiling temperature, the flasks included backflow condensers. The flasks were placed in a water bath, and contained water at a level slightly below the water level of the bath. The temperature of the bath was maintained at 98° C. for 5 hours. The flasks were removed from the bath, and cooled to room temperature. The glass disks were removed from the flasks, cleaned with ethyl alcohol, dried, and weighed to determine the weight loss. The procedure was performed at least 3 times for each sample glass composition, and the results of three consecutive tests were averaged. Weight loss per 1 cm² of a sample's surface area was determined within an accuracy ±0.03 mg/cm².

The bulk modulus of elasticity "K" of each specimen was determined using an impulse acoustical method based on measurements of the rates of spreading longitude and transverse waves in the investigated material. An ultrasonic wave generator permitted registration of the time of the transmission of an ultrasound impulse along a sample of known length. The rates of longitude and transverse waves were then determined with an error of ±5%. The determination of bulk modulus K permitted calculation of Young's modulus E within 1.5-2%, and Poisson's coefficient v within ±2%. Bulk modulus K was determined within ±4%. Before each measurement, the apparatus was calibrated using a standard metallic sample. The following formulas for calculations were used:

$$y = (V_l^2 - 2V_s^2)/(2 \cdot (V_l^2 - V_s^2));$$

$$E = \rho V_l^2 \cdot (1+v)(1-2v)/(1-v);$$

$$K = E/(3 \cdot (1-2v))$$

Where:
  $V_l, V_s$—are the rates of longitudinal and transverse waves,
  $\rho$—is the density.

Density was measured using the hydrostatic method at room temperature with an error of approximately ±0.01%

Coefficients of thermal expansion (CTE) and glass transition temperatures ($T_g$) were determined using a high-precision inclined-axis silica glass dilatometer. Minute changes in the length of a sample caused by its thermal expansion were measured by the dilatometer. All of the samples were thermally conditioned in exactly the same way before testing to ensure identical thermal history. Initial values of $T_g$ were determined using either calculation methods or an express dilatometric test. The samples were heated to a temperature exceeding $T_g$ by approximately 90° C., and maintained at that temperature for approximately 15 minutes. The samples then were cooled at 3° C./min to about 300° C., and the furnace was switched off to allow the "conditioned" or "stabilized" samples cool to room temperature.

The coefficient of thermal expansion (CTE) was measured in the interval between room temperature and 300° C. For each sample, three cycles of subsequent heating and cooling were performed. Each cycle included an isothermal hold at room temperature for 30 min., subsequent heating to 300° C., an isothermal hold for 30 minutes at 300° C., and cooling and holding at room temperature. At the end of each isothermal hold, the length of each sample was measured. Thus for every heating/cooling cycle, two results were obtained. A mean value was determined from the six total results for each specimen. The dilatometer was regularly calibrated using a standard sample made of mono-crystalline corundum. The standard error for CTE measurements was ±1·10⁻⁷ C⁻¹, and the standard error for $T_g$ measurements was ±1 degree C.

Unlike other modern low-permitivity glasses that emphasize the presence of relatively expensive constituents such as $TiO_2$, phosphates, and the like, a glass composition according to the present invention can be produced from a number relatively inexpensive and readily available materials, including limestone, silica flour, calcined alumina or clay, and fluorspar. The present glass composition includes no MgO, which can increase batching costs, cause undesirable phase separation, decrease water resistance, increase the dielectric constant and the dielectric loss tangent of the glass composition to unacceptable levels, and, if supplied as raw dolomite, can cause decrepitation. $Al_2O_3$ is present in amounts of at least 11% by weight to improve water durability, but is limited to not more than 16% by weight in order not to unduly increase the liquidus temperature, cause a narrow working temperature range, or cause devitrification during fiber forming. CaO is included in the composition in an amount of at least 4 percent by weight to improve fusibility and lower viscosity, but is limited in amount in order not to adversely increase the liquidus temperature and the dielectric constant. Limiting the content of $SiO_2$ in the composition to 60% or less ensures good fusibility, and when the composition is used in circuit boards, ensures good drillability of such boards. The presence of $F_2$ in the composition lowers the viscosity at the glass fiber forming temperature, lowers the density and refractive index of the glass, improves the dielectric properties of the glass, improves fusibility, lowers the glass surface tension, and lowers the amount of foam or scum that forms in conventional glass melters. The inclusion of $F_2$ also helps to minimize boron condensation during fiber formation.

As shown in Table 1, at 1 MHz, the glass compositions in the Examples exhibit a dielectric constant less than 5, and a dielectric loss tangent of $5 \times 10^{-4}$ or less. Specifically, at 1 MHz, the dielectric constant is 4.38 to 4.98, and the dielectric loss tangent is $3 \times 10^{-4}$ to $5 \times 10^{-4}$. Also as shown in Table 1, at 10 GHz, the glass compositions in the Examples have a dielectric constant less than 5, and a dielectric loss tangent of less than or equal to $32 \times 10^{-4}$. Specifically, at 10 GHz, the dielectric constant is 4.32 to 4.73, and the dielectric loss tangent is $21 \times 10^{-4}$ to $32 \times 10^{-4}$. Accordingly, the glass compositions in the Examples exhibited a low dielectric constant and low dielectric loss tangent nearly equivalent to the dielectric properties of D-glass. In addition, as shown in Table 1, for those examples tested at 18 GHz, the glass compositions in the Examples had a dielectric constant less than 5, and a dielectric loss tangent of less than or equal to $30 \times 10^{-4}$. Specifically, at 18 GHz, the dielectric constant is 4.49 to 4.67, and the dielectric loss tangent is $27 \times 10^{-4}$ to $30 \times 10^{-4}$.

In addition, as shown in Table 1, the glass compositions in the Examples exhibited a glass elution amount of about 0.10 mg/cm² to about 0.27 mg/cm², and thus are excellent in water resistance. The glass elution amounts of the glass compositions in the Examples is slightly higher than E-glass, which has a glass elution amount measured to be about 0.06 mg/cm². D-glass, however, is known to have much lower resistance to water than E-glass. Typical published values show glass elution for D-glass to be about 10-15 times higher than for E-glass. Thus, the glass compositions in the Examples compare very favorably to D-glass.

Furthermore, those temperatures at which the glass compositions in the Examples exhibited viscosities equal to 10³ poise at relatively low temperatures compared to D-glass, which typically has such a viscosity at a temperature greater than about 1400 degrees C. Such low temperatures are favorable for fiberizing a glass composition according to the invention into glass fibers.

The liquidus temperature is the temperature at and below which crystals form in molten glass. Therefore, to avoid breaks in the fiber forming process, it is critical that the glass temperature in the melting and forming processes remain above the liquidus temperature. It is common in the glass fiber industry to compare the Delta T (T3−$T_{liquidus}$) of different glasses to predict how well a glass will fiberize. Glasses with higher Delta T values are preferred. For example, glasses with Delta T values greater than 100° C. would be preferred to glasses with Delta T values less than 50° C. Thus, the glass compositions in Examples D53, D55, D57, D58, D59, and D47-2 may be preferred over the glass compositions in Examples E3, E9, and E10 with respect to melting and forming characteristics.

In the present invention, it can be seen that a glass fiber having a dielectric constant less than or equal to 5, and a dielectric loss tangent of $4\times10^{-4}$ or less at 1 MHz, $32\times10^{-4}$ or less at 10 GHz, and $30\times10^{-4}$ or less at 18 GHz can be obtained by adjusting the content of $SiO_2$ to about 54-58% by weight, adjusting the content of $Al_2O_3$ to about 11-14% by weight, adjusting the content of $B_2O_3$ to about 24-27% by weight, and adjusting the content of CaO to about 5-6% by weight. Such a composition also can include up to about 2% by weight of $F_2$. In addition, the Examples show that adjusting the content of $SiO_2$ to about 53-58% by weight, adjusting the content of $Al_2O_3$ to about 11-15% by weight, adjusting the content of $B_2O_3$ to about 22-28% by weight, and adjusting the content of CaO to about 5-6% by weight also yields acceptably low dielectric loss tangents. The composition also can include up to about 2% by weight of $F_2$. In addition, it is believed that adjusting the content of $SiO_2$ to about 52-60% by weight, adjusting the content of $Al_2O_3$ to about 11-16% by weight, adjusting the content of $B_2O_3$ to about 20-30% by weight, and adjusting the content of CaO to about 4-8% by weight will yield acceptably low dielectric loss tangents and other desirable properties. As discussed above, others previously have found that including at least about 4 percent CaO by weight can be effective to decrease viscosity and ease melting of a glass composition. Such a composition also may include $F_2$ up to about 2% by weight.

The glass fiber of the present invention has a low dielectric constant and low dielectric loss tangent, and is excellent as a glass fiber for printed wiring boards. The glass fiber is particularly well suited for reinforcing printed wiring boards for high-density circuits. Furthermore, the glass used to make fibers has relatively low melting temperatures, excellent workability, excellent water resistance, and excellent thermal expansion properties. Therefore, a stable low-dielectric glass fiber can be readily produced.

A variety of base materials containing the glass fiber of the present invention can be produced, including, but not limited to, woven fabrics, non-woven fabrics, unidirectional fabrics, knitted products, chopped strand, roving, filament wound products, glass powder, and mat. Composite materials formed from at least one of these base materials and a plastic (such as a sheet molding compound, a bulk molding compound, or a prepeg) also can be used as reinforcements for peripheral communication devices, and the like. For example, a composite material that includes glass fibers according to the invention can be used in radar transparency applications at frequencies ranging from about 300 MHz to about 30 GHz.

What is claimed is:

1. A low-dielectric-constant glass fiber consisting essentially of 52 to 60% of $SiO_2$, 11 to 16% of $Al_2O_3$, 20 to 30% of $B_2O_3$, and 4 to 8% of CaO, by weight, as a glass composition.

2. The low-dielectric-constant glass fiber of claim 1, wherein the glass fiber consists essentially of 53 to 58% of $SiO_2$, 11 to 15% of $Al_2O_3$, 22 to 27% of $B_2O_3$, and 5 to 8% of CaO by weight, as a glass composition.

3. The low-dielectric-constant glass fiber of claim 1, wherein the glass fiber consists essentially of 54 to 58% of $SiO_2$, 11 to 14% of $Al_2O_3$, 24 to 27% of $B_2O_3$, and 5 to 6% of CaO by weight, as a glass composition.

4. The low-dielectric-constant glass fiber of claim 1, wherein the glass fiber further contains up to about 2% $F_2$ by weight.

5. The low-dielectric-constant glass fiber of claim 2, wherein the glass fiber further contains up to about 2% $F_2$ by weight.

6. The low-dielectric-constant glass fiber of claim 3, wherein the glass fiber further contains up to about 2% $F_2$ by weight.

7. The low-dielectric-constant glass fiber of claim 1, wherein the glass fiber has a dielectric constant less than or equal to about 5, and a dielectric loss tangent less than or equal to about $5\times10^{-4}$ at a frequency of 1 MHz at room temperature.

8. The low-dielectric-constant glass fiber of claim 2, wherein the glass fiber has a dielectric constant less than or equal to about 5, and a dielectric loss tangent less than or equal to about $5\times10^{-4}$ at a frequency of 1 MHz at room temperature.

9. The low-dielectric-constant glass fiber of claim 3, wherein the glass fiber has a dielectric constant less than or equal to about 5, and a dielectric loss tangent less than or equal to about $5\times10^{-4}$ at a frequency of 1 MHz at room temperature.

10. The low-dielectric-constant glass fiber of claim 1, wherein the glass fiber has a dielectric constant less than or equal to about 5, and a dielectric loss tangent less than or equal to about $32\times10^{-4}$ at a frequency of 10 GHz at room temperature.

11. The low-dielectric-constant glass fiber of claim 2, wherein the glass fiber has a dielectric constant less than or equal to about 5, and a dielectric loss tangent less than or equal to about $32\times10^{-4}$ at a frequency of 10 GHz at room temperature.

12. The low-dielectric-constant glass fiber of claim 3 wherein the glass fiber has a dielectric constant less than or equal to about 5, and a dielectric loss tangent less than or equal to about $32\times10^{-4}$ at a frequency of 10 GHz at room temperature.

13. The low-dielectric-constant glass fiber of claim 1, wherein the glass fiber has a dielectric constant less than or equal to about 5, and a dielectric loss tangent less than or equal to about $30\times10^{-4}$ at a frequency of 18 GHz at room temperature.

14. The low-dielectric-constant glass fiber of claim 2, wherein the glass fiber has a dielectric constant less than or equal to about 5, and a dielectric loss tangent less than or equal to about $30\times10^{-4}$ at a frequency of 18 GHz at room temperature.

15. The low-dielectric-constant glass fiber of claim 3 wherein the glass fiber has a dielectric constant less than or equal to about 5, and a dielectric loss tangent less than or equal to about $30\times10^{-4}$ at a frequency of 18 GHz at room temperature.

16. A product comprising a glass fiber according to claim 1, the product being selected from the group consisting of a printed circuit board, a woven fabric, a non-woven fabric, a unidirectional fabric, a chopped strand, a chopped strand mat, a composite material, and a communication signal transport medium.

17. A product comprising a glass fiber according to claim 2, the product being selected from the group consisting of a printed circuit board, a woven fabric, a non-woven fabric, a unidirectional fabric, a chopped strand, a chopped strand mat, a composite material, and a communication signal transport medium.

18. A product comprising a glass fiber according to claim 3, the product being selected from the group consisting of a printed circuit board, a woven fabric, a non-woven fabric, a unidirectional fabric, a chopped strand, a chopped strand mat, a composite material, and a communication signal transport medium.

19. A low-dielectric-constant glass fiber comprising 52 to 60% of $SiO_2$, 11 to 16% of $Al_2O_3$, 20 to 30% of $B_2O_3$, and 4 to 8% of CaO, by weight, as a glass composition, and comprising substantially no MgO, substantially no $Li_2O$, substantially no $Na_2O$, substantially no $K_2O$, and substantially no $TiO_2$.

20. The low-dielectric-constant glass fiber of claim 19, wherein the glass fiber comprises 53 to 58% of $SiO_2$, 11 to 15% of $Al_2O_3$, 22 to 27% of $B_2O_3$, and 5 to 8% of CaO by weight, as a glass composition, and comprises substantially no MgO, substantially no $Li_2O$, substantially no $Na_2O$, substantially no $K_2O$, and substantially no $TiO_2$.

21. The low-dielectric-constant glass fiber of claim 19, wherein the glass fiber comprises 54 to 58% of $SiO_2$, 11 to 14% of $Al_2O_3$, 24 to 27% of $B_2O_3$, and 5 to 6% of CaO by weight, as a glass composition, and comprises substantially no MgO, substantially no $Li_2O$, substantially no $Na_2O$, substantially no $K_2O$, and substantially no $TiO_2$.

22. The low-dielectric-constant glass fiber of claim 19, wherein the glass fiber further contains up to about 2% $F_2$ by weight.

23. The low-dielectric-constant glass fiber of claim 20, wherein the glass fiber further contains up to about 2% $F_2$ by weight.

24. The low-dielectric-constant glass fiber of claim 21, wherein the glass fiber further contains up to about 2% $F_2$ by weight.

25. The low-dielectric-constant glass fiber of claim 19, wherein the glass fiber has a dielectric constant less than or equal to about 5, and a dielectric loss tangent less than or equal to about $5\times10^{-4}$ at a frequency of 1 MHz at room temperature.

26. The low-dielectric-constant glass fiber of claim 20, wherein the glass fiber has a dielectric constant less than or equal to about 5, and a dielectric loss tangent less than or equal to about $5\times10^{-4}$ at a frequency of 1 MHz at room temperature.

27. The low-dielectric-constant glass fiber of claim 21, wherein the glass fiber has a dielectric constant less than or equal to about 5, and a dielectric loss tangent less than or equal to about $5\times10^{-4}$ at a frequency of 1 MHz at room temperature.

28. The low-dielectric-constant glass fiber of claim 19, wherein the glass fiber has a dielectric constant less than or equal to about 5, and a dielectric loss tangent less than or equal to about $32\times10^{-4}$ at a frequency of 10 GHz at room temperature.

29. The low-dielectric-constant glass fiber of claim 20, wherein the glass fiber has a dielectric constant less than or equal to about 5, and a dielectric loss tangent less than or equal to about $32\times10^{-4}$ at a frequency of 10 GHz at room temperature.

30. The low-dielectric-constant glass fiber of claim 21 wherein the glass fiber has a dielectric constant less than or equal to about 5, and a dielectric loss tangent less than or equal to about $32\times10^{-4}$ at a frequency of 10 GHz at room temperature.

31. The low-dielectric-constant glass fiber of claim 19, wherein the glass fiber has a dielectric constant less than or equal to about 5, and a dielectric loss tangent less than or equal to about $30\times10^{-4}$ at a frequency of 18 GHz at room temperature.

32. The low-dielectric-constant glass fiber of claim 20, wherein the glass fiber has a dielectric constant less than or equal to about 5, and a dielectric loss tangent less than or equal to about $30\times10^{-4}$ at a frequency of 18 GHz at room temperature.

33. The low-dielectric-constant glass fiber of claim 21 wherein the glass fiber has a dielectric constant less than or equal to about 5, and a dielectric loss tangent less than or equal to about $30\times10^{-4}$ at a frequency of 18 GHz at room temperature.

34. A product comprising a glass fiber according to claim 19, the product being selected from the group consisting of a printed circuit board, a woven fabric, a non-woven fabric, a unidirectional fabric, a chopped strand, a chopped strand mat, a composite material, and a communication signal transport medium.

35. A product comprising a glass fiber according to claim 20, the product being selected from the group consisting of a printed circuit board, a woven fabric, a non-woven fabric, a unidirectional fabric, a chopped strand, a chopped strand mat, a composite material, and a communication signal transport medium.

36. A product comprising a glass fiber according to claim 21, the product being selected from the group consisting of a printed circuit board, a woven fabric, a non-woven fabric, a unidirectional fabric, a chopped strand, a chopped strand mat, a composite material, and a communication signal transport medium.

* * * * *